United States Patent [19]

Avery

[11] Patent Number: 4,567,500
[45] Date of Patent: Jan. 28, 1986

[54] SEMICONDUCTOR STRUCTURE FOR PROTECTING INTEGRATED CIRCUIT DEVICES

[75] Inventor: Leslie R. Avery, Flemington, N.J.
[73] Assignee: RCA Corporation, Princeton, N.J.
[21] Appl. No.: 644,452
[22] Filed: Aug. 27, 1984

Related U.S. Application Data

[63] Continuation of Ser. No. 326,219, Dec. 1, 1981, abandoned, which is a continuation-in-part of Ser. No. 230,357, Jan. 30, 1981, abandoned.

[51] Int. Cl.$^4$ .......................................... H01L 29/74
[52] U.S. Cl. .............................. 357/38; 307/252 A; 307/318; 307/545; 357/13; 357/51; 357/86; 361/56; 361/91
[58] Field of Search .......... 307/252 A, 252 C, 252 D, 307/303, 305, 318, 545, 200 A; 361/56, 91, 111; 357/38, 51, 13, 86

[56] References Cited

U.S. PATENT DOCUMENTS

| | | | |
|---|---|---|---|
| 3,089,998 | 5/1963 | Reuther | 307/252 A |
| 3,210,620 | 10/1965 | Lin | 357/13 |
| 3,213,349 | 10/1965 | Gutzwiller | 361/56 |
| 3,401,319 | 9/1968 | Watkins | 357/43 |
| 3,509,382 | 4/1970 | Zgebura | 361/91 |
| 3,524,113 | 8/1970 | Agusta et al. | 317/253 |
| 3,573,550 | 4/1971 | Baker | 357/252 A |
| 3,638,081 | 1/1972 | Lloyd | 357/51 |
| 3,697,807 | 10/1972 | Christ | 307/252 D |
| 3,787,717 | 1/1974 | Fischer et al. | 361/56 |
| 3,872,495 | 3/1975 | Geller et al. | 357/51 |
| 3,904,931 | 9/1975 | Leidich | 361/56 |
| 3,999,207 | 12/1976 | Arai | 357/38 |
| 4,106,048 | 8/1978 | Khajezadeh | 361/56 |
| 4,114,072 | 9/1978 | Willis | 315/411 |
| 4,178,619 | 12/1979 | Seiler et al. | 361/111 |
| 4,258,311 | 3/1981 | Tokuda et al. | 357/51 |
| 4,258,377 | 3/1981 | Miyata et al. | 357/38 |
| 4,286,177 | 8/1981 | Hart et al. | 357/35 |
| 4,377,832 | 3/1983 | Toney et al. | 307/252 R |

FOREIGN PATENT DOCUMENTS

| | | |
|---|---|---|
| 1919203 | 11/1969 | Fed. Rep. of Germany ...... 307/318 |
| 1901075 | 8/1970 | Fed. Rep. of Germany ........ 361/91 |
| 2706031 | 8/1978 | Fed. Rep. of Germany ........ 357/38 |
| 2854901 | 7/1979 | Fed. Rep. of Germany ........ 357/13 |
| 2951421 | 9/1980 | Fed. Rep. of Germany . |
| 54-25445 | 2/1979 | Japan ..................................... 361/56 |
| 54-58380 | 5/1979 | Japan ..................................... 357/13 |
| 55-41788 | 3/1980 | Japan ................................. 357/38 L |
| 1532428 | 10/1974 | United Kingdom . |
| 1551760 | 8/1979 | United Kingdom . |
| 2056808 | 3/1981 | United Kingdom . |

OTHER PUBLICATIONS

"SCR Manual", 1961, pp. 94–95.
Goldthorp et al., "An Integrated Circuit Composite PNPN Diode", IEDM, 1979, pp. 180–183.
J. Iseli, Bull. SEV 63, (1972), 2,22 Jan. "Empfindlichkeit und Schutz Integrierter Shaltkreise Gegen Uberspannungen".

Primary Examiner—Joseph E. Clawson, Jr.
Attorney, Agent, or Firm—Birgit E. Morris; William J. Burke; Henry Steckler

[57] ABSTRACT

Disclosed is a protection circuit which may be used, for example, in a television receiver to protect circuitry inside an integrated circuit from damage due to high voltage transients. The protection circuit comprises a PNPN structure forming a silicon control rectifier (SCR) and a resistive element integral to the SCR structure. In one embodiment the resistive element is a linear resistor and in another embodiment is a non-linear resistor in the form of a diode connected transistor. The SCR and the resistive element are arranged to form a two terminal, high current protection circuit which is rendered conductive when the potential difference across the two terminals is greater than one forward biased PN junction voltage drop. One terminal of the protection circuit is connected to an input or output terminal of the protected circuit, and the other terminal is connected to the most positive power supply potential. Transient voltages appearing at the integrated circuit terminal greater than one PN junction voltage drop above the positive power supply potential causes the protection circuit to conduct current, thereby dissipating the energy of the high voltage transient and protecting the integrated circuit from damage.

10 Claims, 4 Drawing Figures

SEMICONDUCTOR STRUCTURE FOR PROTECTING INTEGRATED CIRCUIT DEVICES

This application is a continuation of an application filed in the U.S. Patent and Trademark Office on Dec. 1, 1981, Ser. No. 326,219, now abandoned and which was a continuation-in-part of an application filed in the U.S. Patent and Trademark Office on Jan. 30, 1981, Ser. No. 230,357 which was also abandoned.

FIELD OF THE INVENTION

This invention relates to integrated circuit (IC) protection devices.

BACKGROUND OF THE INVENTION

Many types of electrical equipment contain IC devices which are vulnerable to damage from high voltage transients.

For example, in a television receiver, containing IC's for video and audio signal processing, the anode of the image producing kinescope is typically biased at a high potential, e.g., 25,000 volts. High voltage transients are produced by kinescope arcing which occurs when the high voltage anode of the kinescope is rapidly discharged. Kinescope arcing can also occur unpredictably between the anode and one or more of the other lower potential electrodes of the kinescope when the television receiver is in normal operation. In either case, kinescope arcing results in high voltage transients having positive and negative peaks often in excess of 100 volts at the IC terminals and lasting from one to several microseconds.

Another cause of high voltage transients in a television receiver is electrostatic discharge. A build-up of electrostatic charge may be discharged by the user through the television receiver controls thereby producing a high voltage transient which can damage IC's in the television receiver.

SUMMARY OF THE INVENTION

The present invention is embodied in an integrated circuit semiconductor protection circuit comprising a pair of complementary conductivity transistors and a resistive (either linear or non-linear) element integral to the semiconductor structure. The pair of complementary conductivity transistors and the resistive element are arranged to form a two terminal device capable of conducting a high current when the potential difference across its two terminals exceeds a predetermined threshold. The protection device is connected at one terminal thereof to a circuit terminal of the circuit to be protected, and at the other terminal thereof to a source of operating potential. When the potential at the circuit terminal of the protected circuit exceeds the operating supply potential by an amount equal to the predetermined threshold, the protection circuit is rendered conductive thereby protecting the IC from damage.

DETAILED DESCRIPTION

Figure 1:
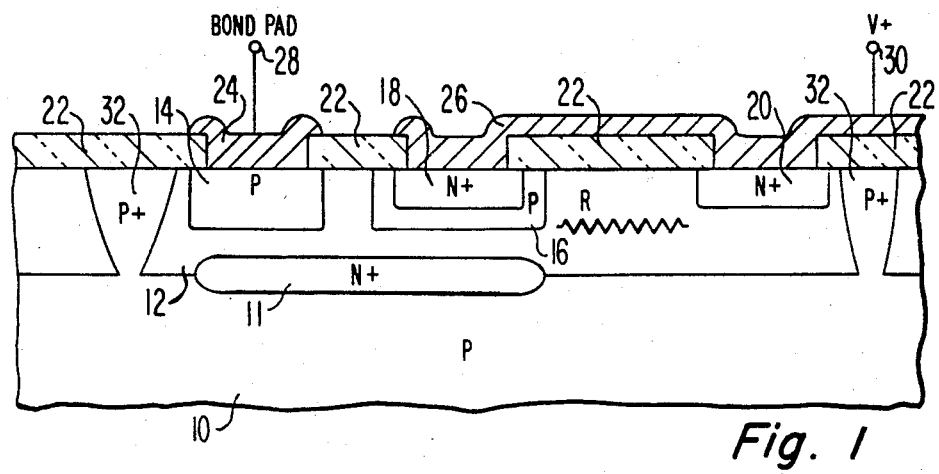
FIG. 1 is a cross-sectional view of one embodiment of a semiconductor structure embodying a protection circuit in accordance with the present invention.

As shown in FIG. 1, a semiconductor circuit is fabricated on a substrate 10 which may consist of P type silicon material. An epitaxial layer 12 which may consist of N− type conductivity is disposed on the substrate 10. A P type region 14 is formed within the N− type epitaxial layer 12, forming a PN junction with the N− type layer 12. Another P type region 16 is formed within the N− type epitaxial layer 12, forming a PN junction with the epitaxial layer 12. An N+ region 18 is formed within the P type region 16, and it forms a PN junction with the P type region 16. Another N+ type region 20 is formed within the N− type epitaxial layer 12. A buried N+ pocket 11 underlies the P regions 14 and 16.

An insulating layer 22, which may be silicon dioxide, overlies the surface of the N− epitaxial layer 12. Openings are formed in the insulating layer 22 over regions 14, 18 and 20 in order to make respective electrical contact thereto. A conductive layer 26, which may for example be aluminum, overlies the insulating layer 22, and makes contact with regions 18 and 20. The conductive layer 26 is further connected to a terminal 30 which receives a positive operating supply potential V+. A conductive layer 24, which may also be aluminum, extends through an opening in the insulating layer 22 to make contact with region 14. A bond pad 28 is connected to region 14 through conductive layer 24. The bond pad 28 is further connected to an input or output terminal of a utilization circuit (not shown) elsewhere on the IC. A P+ region 32 extends from the surface of epitaxial layer 12 to the substrate 10. Region 32 surrounds the epitaxial layer 12, isolating the protection circuit from other circuits on the substrate 12.

Figure 2:
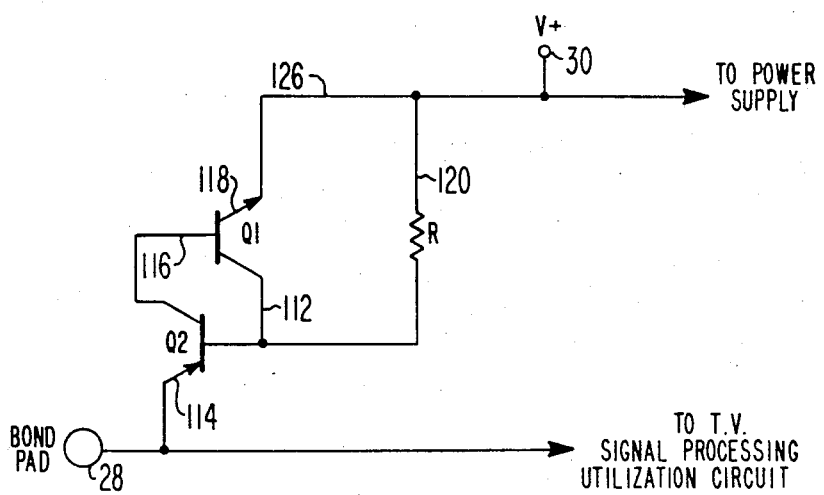
FIG. 2 is a schematic diagram of the embodiment of the semiconductor protection circuit of FIG. 1.

FIG. 2 is a circuit diagram of the structure illustrated in FIG. 1 wherein the resistive element is linear. The protection circuit comprises an NPN transistor Q1, a PNP transistor Q2, and a linear resistive element designated as resistor R. The emitter electrode 118, base electrode 116, collector electrode 112 of transistor Q1 correspond to regions 18, 16 and 12 respectively in FIG. 1. The emitter electrode 114, base electrode 112 and collector electrode 116 of transistor Q2 correspond to regions 14, 12 and 16 respectively in FIG. 1. Resistor R, designated as 120, is connected between the base electrode of Q2 and the emitter electrode of Q1 and corresponds to that region of the N− type epitaxial layer 12 between P region 16 and N+ region 20 in FIG. 1. Conductor 126, between the emitter electrode of transistor Q1 and resistor R, corresponds to conductive layer 26 in FIG. 1.

The value of resistor R is determined by the resistivity of the N− epitaxial layer 12 and the geometry of the N− epitaxial layer situated between P region 16 and N+ region 20 (FIG. 1). For example, the resistance of resistor R may be increased by locating N+ region 20 further away from P region 16. Also, the buried N+ region 11 significantly lowers the resistivity of the N− epitaxial layer 12. Therefore, the buried N+ region 11, while disposed directly beneath P regions 14 and 16, does not extend beneath that portion of the N− epitaxial layer 12 between P region 16 and N+ region 20.

In FIG. 2, transistors Q1 and Q2 are connected to form a silicon controlled rectifier (SCR). Specifically, the base electrode of Q1 is connected to the collector electrode of Q2, and the base electrode of Q2 is connected to the collector electrode of Q1. The resistor R is effectively connected in parallel with the collector-emitter conduction path of transistor Q1.

Figure 3:
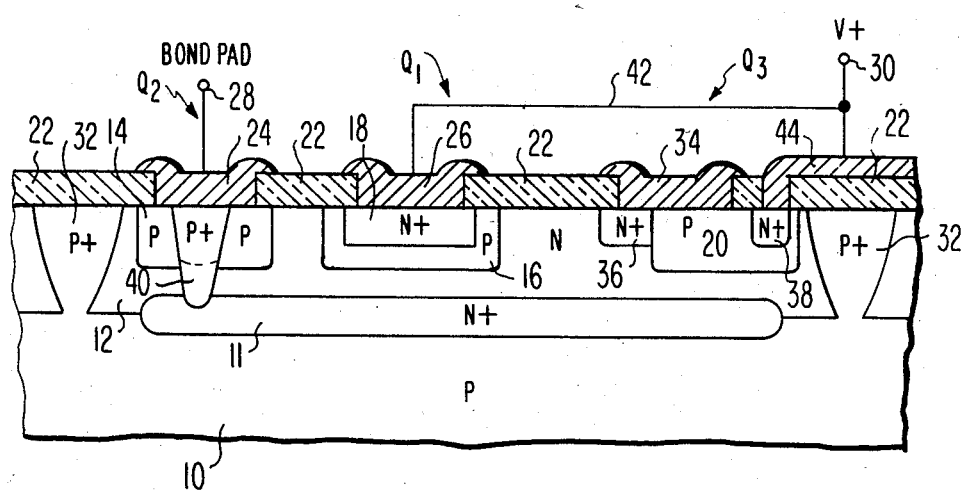
FIG. 3 is a cross-sectional view of another embodiment of a semiconductor structure embodying the protection circuit in accordance with the present invention.

Referring now to FIG. 3, there is shown a semiconductor circuit fabricated on a substrate 10 which typically may consist of P type silicon material having a buried region 11 of N+ type conductivity. An epitaxial layer 12 of N− type conductivity is disposed on the substrate 10. A P type region 14 is formed within the N− type epitaxial layer 12, forming a PN junction with the N− type layer 12. Another P type region 16 is formed within the N− type epitaxial layer 12, forming a PN junction with the epitaxial layer 12. An N+ region 18 is formed within the P type region 16 to form a PN junction with the P type region 16. The combination of regions 12, 16 and 18 represents the collector, base and emitter, respectively, of transistor Q1. In this embodiment, a P type region 20 is formed within the N− type epitaxial layer 12 and an N+ region 38, is formed within P type region 20. Regions 20 and 38 together with N+ region 36 formed in N− epitaxial layer 12 adjacent P type region 20, represents the emitter, base and collector respectively of transistor Q3. A buried N+ pocket 11 underlies the P regions 14, 16 and 20.

An insulating layer 22, which may be silicon dioxide, overlies the surface of the N− epitaxial layer 12. Openings are formed in the insulating layer 22 over regions 14, 18, 36, 38 and 20 in order to make respective electrical contacts thereto. A conductive contact 26, which may for example be aluminum, extends through the insulating layer 22, and makes ohmic contact with region 18. While conductive contact 34, which may be aluminum, makes ohmic contact with regions 36 and 20 to short the base and collector regions of Q3 to form a diode. The conductive contact 26 is further connected, by means of lead 42, to a terminal 30 which receives a positive operating supply potential V+. A conductive layer 24, which may also be aluminum, extends through an opening in the insulating layer 22 to make contact with region 14. A bond pad 28 is connected to region 14 through the conductive layer 24. The bond pad 28 is further connected to an input or output terminal of a utilization circuit (not shown) elsewhere on the IC. A P+ isolation region 32 extends from the surface of epitaxial layer 12 to the substrate 10 and also surrounds the epitaxial layer 12 in order to isolate the protection circuit from other circuits on the substrate 12. It should be here noted when isolation region 32 is formed, P+ region 40 may also be formed in region 14. This added region 40 tends to improve the emitter injection efficiency and lower the contact resistance or "on" resistance of Q2.

Figure 4:
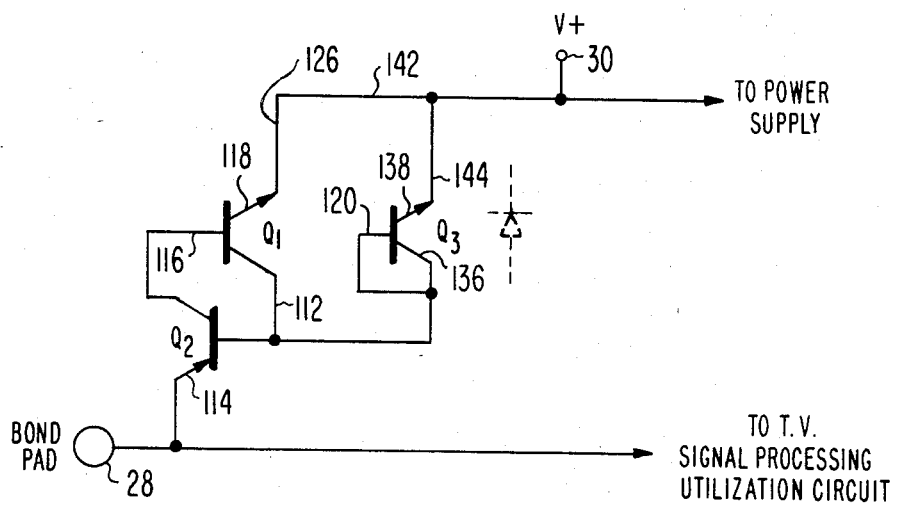
FIG. 4 is a schematic diagram of the embodiment of the semiconductor protection circuit of FIG. 3.

FIG. 4 is a schematic circuit diagram of the structure illustrated in FIG. 3 wherein the resistive element is a non-linear resistive element in the form of a diode. The protection circuit comprises an NPN transistor Q1, a PNP transistor Q2, and a non-linear resistive element formed by an NPN transistor Q3 connected as a diode. The emitter electrode 118, the base electrode 116, and the collector electrode 112 of transistor Q1 corresponds to regions 18, 16 and 12 respectively in FIG. 3. The emitter electrode 114, the base electrode 112 and the collector electrode 116 of transistor Q2 correspond to regions 14, 12 and 16 respectively in FIG. 3. Q3, connected as a diode, is connected between the base electrode of Q2 and a source of operating potential 30. The base region 120 and collector region 136 of Q3 are shorted to form a diode by contact 34 (FIG. 3) while the emitter region 138 (region 38, FIG. 3) is connected to the source of operating potential 30 by means of conductor 144 (conductor 44, FIG. 3). To complete the device, conductor 142 connects emitter 138 of Q3 and emitter 118 of Q3 (via contact 126) to source 30.

The value of resistor R (FIG. 1) was determined solely by the resistivity of the N epitaxial layer 12 and the geometry of the N epitaxial layer situated between P region 16 and N+ region 20. For example, the resistance of resistor R may be increased by locating N+ region 20 further away from P region 16. As in the circuit of FIG. 2, base current is needed to trigger Q2 in order to allow regenerative action to take place, causing the transistor combination Q1/Q2 to latch. In the circuit diagram of FIG. 4 the presence of Q3 (the non-linear resistive element) when forward biased adds an additional voltage drop of about 0.6 volt which must be overcome before the triggering action will take place. However, the presence of Q3 adds a reverse bias breakdown voltage of about 7 volts, which is inherent in the diode, together with a reverse bias breakdown of about 8 volts which is attributed to the presence of deep diffusion region 40 in contact with the N+ pocket 11. Thus, I have now achieved a total reverse bias breakdown voltage of about 15 volts which is necessary when operating a power supply at about 12 volts.

As in FIG. 2, transistors Q1 and Q2 of FIG. 4 are connected to form a silicon controlled rectifier (SCR). Specifically, the base electrode of Q1 is connected to the collector electrode of Q2 and the base electrode of Q2 is connected to the collector electrode of Q1. Diode connected Q3 is effectively connected in parallel with the collector-emitter conduction path of transistor Q1.

The resulting protection circuit differs from a conventional SCR device in that the resistive element (the linear resistor R of FIG. 2 or the diode connected transistor of FIG. 4) converts the conventional three terminal SCR device into a two terminal device that is rendered conductive when the voltage across its terminals exceeds a predetermined threshold. Furthermore, unlike a conventional SCR, the present invention does not require a resistor between the base and emitter electrodes of either transistor Q1 or Q2.

The protection circuit of either embodiment (FIGS. 2 and 4) is connected to terminal 30 through conductor 126 which receives a positive operating supply potential V+. The protection circuit is also connected to a bond pad 28 at the emitter electrode of Q2, to which is connected a utilization circuit to be protected.

In operation, the signal at bond pad 28 normally fluctuates at potentials below V+. So long as the potential at bond pad 28 is below V+, the base-emitter junction of transistor Q2 is reverse biased, and transistors Q1 and Q2 are nonconductive.

A high voltage transient appearing at bond pad 28 will cause the potential at bond pad 28 to become more positive than V+. When the potential difference between bond pad 28 and power supply terminal 30 is greater than the combined forward biased base-emitter voltage ($V_{BE}$) of transistors Q2 and Q3, transistor Q2 will begin to conduct collector current. Conduction through the collector electrode of transistor Q2 provides base current to transistor Q1 to conduct. Conduction through the collector electrode of transistor Q1 in turn provides base current for transistor Q2, thereby driving transistor Q2 and transistor Q1 into high conduction. When the current supplied by the high voltage transient from bond pad 28 to power supply terminal 30 falls below a minimum sustaining current, transistor Q2 will turn off which turns off the base current to transistor Q1 and the protection circuit becomes nonconductive.

In such manner, the energy of a high voltage transient producing a positive voltage at bond pad 28 is dissipated by conduction of transistors Q1 and Q2 to power supply terminal 30 thereby protecting the utilization circuit from damage. A semiconductor circuit which may be used for protecting the utilization circuit against damage due to high voltage transients which produce a negative voltage on bond pad 28 may be found in a copending patent application by the present inventor, filed Dec. 3, 1980, Ser. No. 212,534 abandoned, entitled "PROTECTION CIRCUIT FOR INTEGRATED CIRCUIT DEVICE", and assigned to the assignee of the present invention.

What I claim is:

1. In an semiconductor structure for protecting an integrated utilization circuit having a substrate, a bond pad, the utilization circuit including a signal terminal connected to the bond pad, a single semiconductor layer of a first conductivity type disposed on the substrate, the semiconductor layer having a surface, a first semiconductor region of a second conductivity type disposed in PN junction forming relation with the semiconductor layer, a second semiconductor region of the first conductivity type disposed in PN junction forming relation within the first semiconductor region; the improvement comprising:
    a third semiconductor region of the second conductivity type disposed in PN junction forming relation with the semiconductor layer;
    a fourth semiconductor region of the first conductivity type disposed in the semiconductor layer, the fourth semiconductor region being spaced adjacent to the first semiconductor region;
    a fifth semiconductor region of the same conductivity type as the semiconductor layer and positioned solely beneath the first and third semiconductor regions and disposed between the semiconductor layer and the substrate, the fifth semiconductor region having a lower resistivity than that of the semiconductor layer;
    first conductive means for connecting the bond pad to the third semiconductor region;
    a power supply terminal; and
    second conductive means for connecting the second semiconductor region to the fourth semiconductor region and to the power supply terminal.

2. A semiconductor structure according to claim 1 further comprising a sixth semiconductor region of the second conductivity type extending from the surface of the semiconductor layer to the substrate, the sixth semiconductor region surrounding the semiconductor layer.

3. A semiconductor structure according to claim 2 wherein the substrate material is silicon of P type conductivity.

4. A semiconductor protection circuit according to claim 3 wherein the layer is an epitaxial layer of N type conductivity.

5. The semiconductor structure of claim 4 further comprising:
    a linear operating resistive element as represented by the resistance of that portion of the semiconductor layer located between the fourth and the fifth semiconductor regions.

6. In a semiconductor structure for protecting an integrated utilization circuit having: a substrate, a bond pad, the utilization circuit including a single terminal connected to the bond pad a single semiconductor layer of a first conductivity type disposed on the substrate, the semiconductor layer having a surface, a first semiconductor region of a second conductivity type disposed in PN junction forming relation with the semiconductor layer, and a second semiconductor region of the first conductivity type disposed in PN junction forming relation within the first semiconductor region, the improvement comprising:
    a third semiconductor region of the second conductivity type in PN junction forming relation with the semiconductor layer;
    a fourth semiconductor region of the second conductivity type disposed in the semiconductor layer, the fourth semiconductor region being spaced adjacent to the first semiconductor region;
    a fifth semiconductor region of the first conductivity type extending from the surface of the semiconductor layer and being completely surrounded by the fourth semiconductor region;
    a sixth semiconductor region of the first conductivity type extending from the surface of the semiconductor layer adjacent to and abutting the fourth semiconductor region;
    a seventh semiconductor region of the same conductivity type as the semiconductor layer positioned solely beneath the first, third, fourth and sixth semiconductor regions and disposed between the semiconductor layer and the substrate, the seventh semiconductor region having a lower resistivity than that of the semiconductor layer;
    first conductive means for connecting the bond pad to the third semiconductor region;
    a power supply terminal;
    second conductive means for connecting the second semiconductor region to the fifth semiconductor region and to the power supply terminal; and
    third conductive means connecting the fourth semiconductor region to the sixth semiconductor region.

7. A semiconductor structure according to claim 6, is the comprising;
    an eighth semiconductor region, of the second conductivity type extending from the surface of the semiconductor layer to the substrate to surround the semiconductor layer.

8. A semiconductor structure according to claim 7, wherein the substrate material is silicon of P type conductivity.

9. A semiconductor structure according to claim 8, wherein the layer is an epitaxial layer of N type conductivity.

10. The semiconductor structure of claim 9, further comprising:
    a non-linear resistive element, as represented by a diode, formed at the junction of the fourth and fifth regions.

* * * * *